US012751184B2

(12) United States Patent
Song et al.

(10) Patent No.: US 12,751,184 B2
(45) Date of Patent: Sep. 29, 2026

(54) DISPLAY DEVICE

(71) Applicant: SAMSUNG DISPLAY CO., LTD., Yongin-si (KR)

(72) Inventors: Bo Kwang Song, Yongin-si (KR); Gee Bum Kim, Yongin-si (KR); Kwang Soo Bae, Yongin-si (KR); Min Oh Choi, Yongin-si (KR); Soo Yeong Hong, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 372 days.

(21) Appl. No.: 18/508,082

(22) Filed: Nov. 13, 2023

(65) Prior Publication Data

US 2024/0292717 A1 Aug. 29, 2024

(30) Foreign Application Priority Data

Feb. 23, 2023 (KR) ........................ 10-2023-0024375

(51) Int. Cl.
*H10K 59/80* (2023.01)
*G02B 27/00* (2006.01)
(Continued)

(52) U.S. Cl.
CPC ....... *H10K 59/878* (2023.02); *G02B 27/0093* (2013.01); *G02B 27/01* (2013.01);
(Continued)

(58) Field of Classification Search
CPC .. H10K 59/878; H10K 50/844; H10K 50/856; H10K 50/858; H10K 59/35;
(Continued)

(56) References Cited

U.S. PATENT DOCUMENTS 11,489,145 B2 11/2022 Bae et al.
2011/0249214 A1* 10/2011 Cheong .................. G02B 6/002 349/61

(Continued)

FOREIGN PATENT DOCUMENTS

KR 10-2141558 B1 8/2020
KR 10-2021-0004006 A 1/2021

(Continued)

*Primary Examiner* — Earl N Taylor
(74) *Attorney, Agent, or Firm* — Womble Bond Dickinson (US) LLP

(57) ABSTRACT

A display device includes a glass located in a display area of a lens, a display panel including an OLED on a semiconductor wafer substrate, and a reflective member to reflect display light exiting from the display panel toward the glass. The display panel may include an emissive layer including the OLED, an encapsulation layer on the emissive layer, and a light control pattern layer on the encapsulation layer and including an organic film pattern and a planarization film covering an upper surface of the encapsulation layer including the organic film pattern. The organic film pattern is arranged in line with a second color pixel and a third color pixel among a first color pixel, the second color pixel, and the third color pixel, and forms an opening in the first color pixel. A side surface of the organic film pattern adjacent to the opening may include a slope inclined at an angle in the first color pixel.

18 Claims, 14 Drawing Sheets

(51) Int. Cl.

| | |
|---|---|
| ***G02B 27/01*** | (2006.01) |
| ***G02B 27/09*** | (2006.01) |
| ***H10K 50/844*** | (2023.01) |
| ***H10K 50/856*** | (2023.01) |
| ***H10K 50/858*** | (2023.01) |
| ***H10K 59/35*** | (2023.01) |
| ***H10K 59/38*** | (2023.01) |

(52) U.S. Cl.
CPC ..... *G02B 27/0172* (2013.01); *G02B 27/0977* (2013.01); *H10K 50/844* (2023.02); *H10K 50/856* (2023.02); *H10K 50/858* (2023.02); *H10K 59/35* (2023.02); *H10K 59/351* (2023.02); *H10K 59/353* (2023.02); *H10K 59/38* (2023.02); *H10K 59/873* (2023.02); *G02B 2027/0178* (2013.01)

(58) Field of Classification Search
CPC .... H10K 59/351; H10K 59/353; H10K 59/38; H10K 59/873; H10K 59/875; G02B 27/0093; G02B 27/01; G02B 27/0172; G02B 27/0977; G02B 2027/0178; H10H 20/853; H10H 20/856; H10H 29/853; H10H 29/856
See application file for complete search history.

(56) References Cited

U.S. PATENT DOCUMENTS

| | | | | |
|---|---|---|---|---|
| 2021/0013455 | A1* | 1/2021 | Bae | H10K 59/38 |
| 2022/0221750 | A1* | 7/2022 | Hirosawa | G02F 1/13312 |
| 2022/0328030 | A1* | 10/2022 | Park | G10K 11/17857 |
| 2024/0008348 | A1* | 1/2024 | Kim | H10K 59/879 |
| 2024/0130203 | A1* | 4/2024 | Woo | H10K 59/8791 |
| 2024/0188398 | A1* | 6/2024 | Kim | G02B 27/0172 |
| 2024/0237474 | A1* | 7/2024 | Han | H10K 59/50 |
| 2024/0315113 | A1* | 9/2024 | Kim | H10K 59/8723 |

FOREIGN PATENT DOCUMENTS

| | | | |
|---|---|---|---|
| KR | 10-2021-0008265 | A | 1/2021 |
| KR | 10-2022-0064449 | A | 5/2022 |

* cited by examiner

DISPLAY DEVICE

CROSS-REFERENCE TO RELATED APPLICATION

This application claims priority to and benefit of Korean Patent Application No. 10-2023-0024375, filed on Feb. 23, 2023 in the Korean Intellectual Property Office, the entire content of which is herein incorporated by reference.

BACKGROUND

1. Field

Aspects of embodiments of the present disclosure relate to a display device.

2. Description of Related Art

A wearable device is being developed which is in the form of glasses or a helmet and forms a focus at a location close to the user's eyes. For example, a wearable device may be a head mounted display (HMD) device or an augmented reality (AR) glass. Such a wearable device provides a user with an augmented reality (AR) screen or a virtual reality (VR) screen.

A wearable device such as a HMD device and AR glasses require display specifications of at least 2,000 pixels per inch (PPI) to allow users to use the device for a long time without dizziness. To this end, organic light-emitting diode on silicon (OLEDoS) technology is emerging, which may be a high-resolution small organic light-emitting element display device. The OLEDOS is a technology for disposing organic light-emitting diodes (OLEDs) on a semiconductor wafer substrate on which a complementary metal oxide semiconductor (CMOS) is disposed.

SUMMARY

According to an aspect of embodiments of the present disclosure, a display device capable of improving image quality by way of improving emission efficiency of a display panel is provided.

According to one or more embodiments of the present disclosure, a display device includes a glass located in a display area of a lens, a display panel comprising an OLED on a semiconductor wafer substrate, and a reflective member to reflect display light exiting from the display panel toward the glass. The display panel may include an emissive layer comprising the OLED, an encapsulation layer on the emissive layer, and a light control pattern layer on the encapsulation layer and comprising an organic film pattern and a planarization film covering an upper surface of the encapsulation layer comprising the organic film pattern. The organic film pattern is arranged in line with a second color pixel and a third color pixel among a first color pixel, the second color pixel, and the third color pixel, and forms an opening in the first color pixel. A side surface of the organic film pattern adjacent to the opening may include a slope inclined at an angle in the first color pixel.

An emission efficiency of the first color pixel may be lower than an emission efficiency of the second color pixel and an emission efficiency of the third color pixel.

The first color pixel may be a blue pixel emitting blue light. The second color pixel may be a red pixel emitting red light. The third color pixel may be a green pixel emitting green light.

The first color pixel may be a green pixel emitting green light. The second color pixel may be a blue pixel emitting blue light. The third color pixel may be a red pixel emitting red light.

The first color pixel may be a red pixel emitting red light. The second color pixel may be a green pixel emitting green light. The third color pixel may be a blue pixel emitting blue light.

A metal material may be disposed on the slope formed on the side surface of the organic film pattern to reflect light emitted from the emissive layer of the first color pixel toward the side surface of the organic film pattern toward a front side of the display panel.

The emissive layer may be configured to emit white light, and the display device may further include a color filter on the light control pattern layer.

A refractive index of the organic film pattern may be lower than a refractive index of the planarization film.

Light emitted from the emissive layer of the first color pixel to the side surface of the organic film pattern may be totally reflected toward a front side of the display panel via a difference between the refractive index of the organic film pattern and the refractive index of the planarization film.

The reflective member may include a diffractive optical element.

The reflective member may include a reflective optical element.

According to one or more embodiments of the present disclosure, a display device includes a glass located in a display area of a lens, a display panel comprising an OLED on a semiconductor wafer substrate, and a reflective member to reflect display light exiting from the display panel toward the glass. The display panel may include an emissive layer comprising the OLED, an encapsulation layer on the emissive layer, and a light control pattern layer on the encapsulation layer and comprising an organic film pattern and a planarization film covering an upper surface of the encapsulation layer comprising the organic film pattern. The organic film pattern is arranged in line with a third color pixel among a first color pixel, a second color pixel, and the third color pixel, and forms openings in the first and second color pixels. In each of the first and second color pixels, a side surface of the organic film pattern adjacent to the opening may include a slope inclined at an angle.

An emission efficiency of the third color pixel may be higher than an emission efficiency of the first color pixel and an emission efficiency of the second color pixel.

The first color pixel may be a blue pixel emitting blue light, the second color pixel may be a red pixel emitting red light, and the third color pixel may be a green pixel emitting green light.

The first color pixel may be a green pixel emitting green light, the second color pixel may be a blue pixel emitting blue light, and the third color pixel may be a red pixel emitting red light.

The first color pixel may be a red pixel emitting red light, the second color pixel may be a green pixel emitting green light, and the third color pixel may be a blue pixel emitting blue light.

The display device may further include a metal material on the slope of the side surface of the organic film pattern to reflect light emitted from the emissive layer of the first or second color pixel toward the side surface of the organic film pattern toward a front side of the display panel.

The emissive layer may be configured to emit white light, and the display device may further include a color filter on the light control pattern layer.

A refractive index of the organic film pattern may be lower than a refractive index of the planarization film.

Light emitted from the emissive layer of the first color pixel to the side surface of the organic film pattern may be totally reflected toward a front side of the display panel via a difference between the refractive index of the organic film pattern and the refractive index of the planarization film.

BRIEF DESCRIPTION OF THE DRAWINGS

The above and other aspects and features of the present disclosure will become more apparent by describing in detail exemplary embodiments thereof with reference to the attached drawings, in which.

DETAILED DESCRIPTION

The present invention will now be described more fully herein with reference to the accompanying drawings, in which some embodiments of the invention are shown. The present invention may, however, be embodied in different forms and should not be construed as limited to the embodiments set forth herein. Rather, these embodiments are provided so that this disclosure will be thorough and complete, and will fully convey the scope of the invention to those skilled in the art.

It is also to be understood that when a layer is referred to as being "on" another layer or substrate, it may be directly on the other layer or substrate, or one or more intervening layers may also be present. The same reference numbers indicate the same components throughout the specification.

It is to be understood that, although the terms "first," "second," etc. may be used herein to describe various elements, these elements should not be limited by these terms. These terms are used to distinguish one element from another element.

For instance, a first element discussed below could be termed a second element without departing from the teachings of the present invention. Similarly, the second element could also be termed the first element.

Features of each of various embodiments of the present disclosure may be partially or entirely combined with each other and may technically variously interwork with each other, and respective embodiments may be implemented independently of each other or may be implemented together in association with each other.

Unless otherwise defined, all terms (including technical and scientific terms) used herein have the same meaning as commonly understood by one of ordinary skill in the art to which the inventive concept pertains. It is also to be understood that terms defined in commonly used dictionaries should be interpreted as having meanings consistent with the meanings in the context of the related art, and they are not interpreted in an ideal or overly formal sense, unless expressly defined herein.

Herein, some embodiments will be described with reference to the accompanying drawings.

Figure 1:
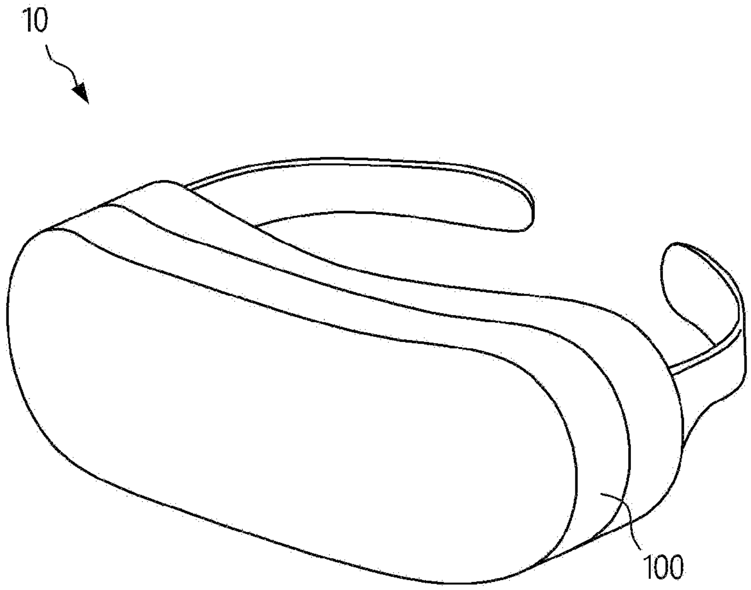
FIG. 1 shows a front side of a wearable device including a display device according to an embodiment.
Figure 2:
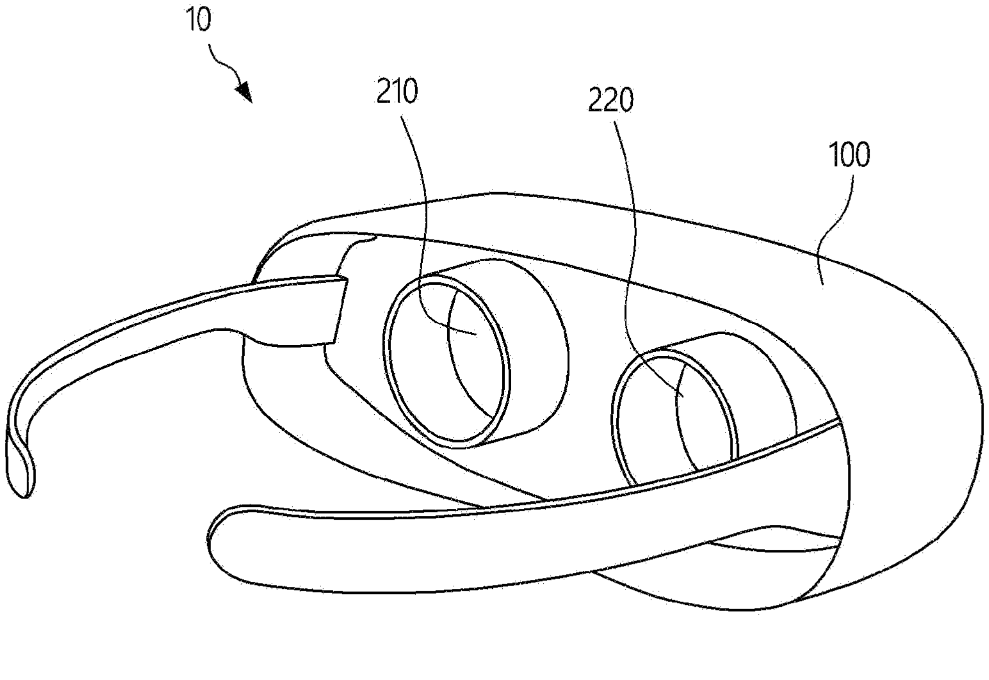
FIG. 2 shows a rear side of the wearable device shown in FIG. 1.

FIG. 1 shows a front side of a wearable device 100 including a display device 10 according to an embodiment; and FIG. 2 shows a rear side of the wearable device 100 shown in FIG. 1.

Referring to FIGS. 1 and 2, the display device 10 according to an embodiment may be a display device included in an HMD device. In the HMD device, the display device 10 is disposed inside a body, and lenses 200 for displaying the images may be disposed on the rear surface of the body. The lens 200 may include a left eye lens 210 associated with a user's left eye, and a right eye lens 220 associated with the user's right eye. Each of the left eye lens 210 and the right eye lens 220 may include glass for displaying images output from the display device 10. A method of displaying images through the glass of the display device 10 will be described in further detail later with reference to FIGS. 5 and 9.

Figure 3:
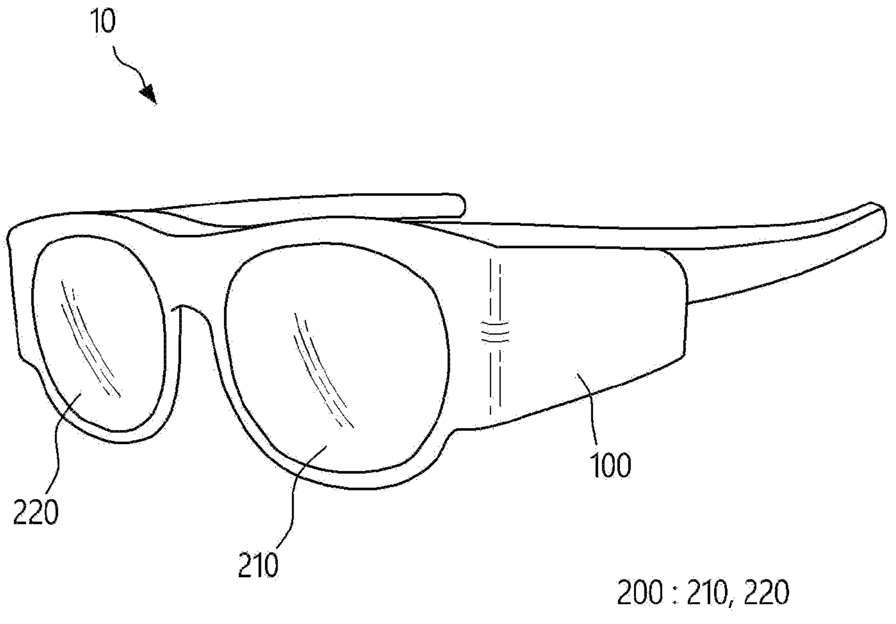
FIG. 3 shows another example of a wearable device including a display device according to an embodiment.

FIG. 3 shows another example of the wearable device 100 including the display device 10 according to an embodiment.

Referring to FIG. 3, the display device 10 according to an embodiment may be a display device included in AR glasses. The AR glasses have a shape of glasses and may include see-through lenses. The see-through lenses 200 may include a left eye lens 210 associated with a user's left eye, and a right eye lens 220 associated with the user's right eye. Each of the left eye lens 210 and the right eye lens 220 may include glass for displaying images output from the display device 10. A method of displaying images through the glass of the display device 10 will be described later in further detail with reference to FIGS. 5 and 9.

Figure 4:
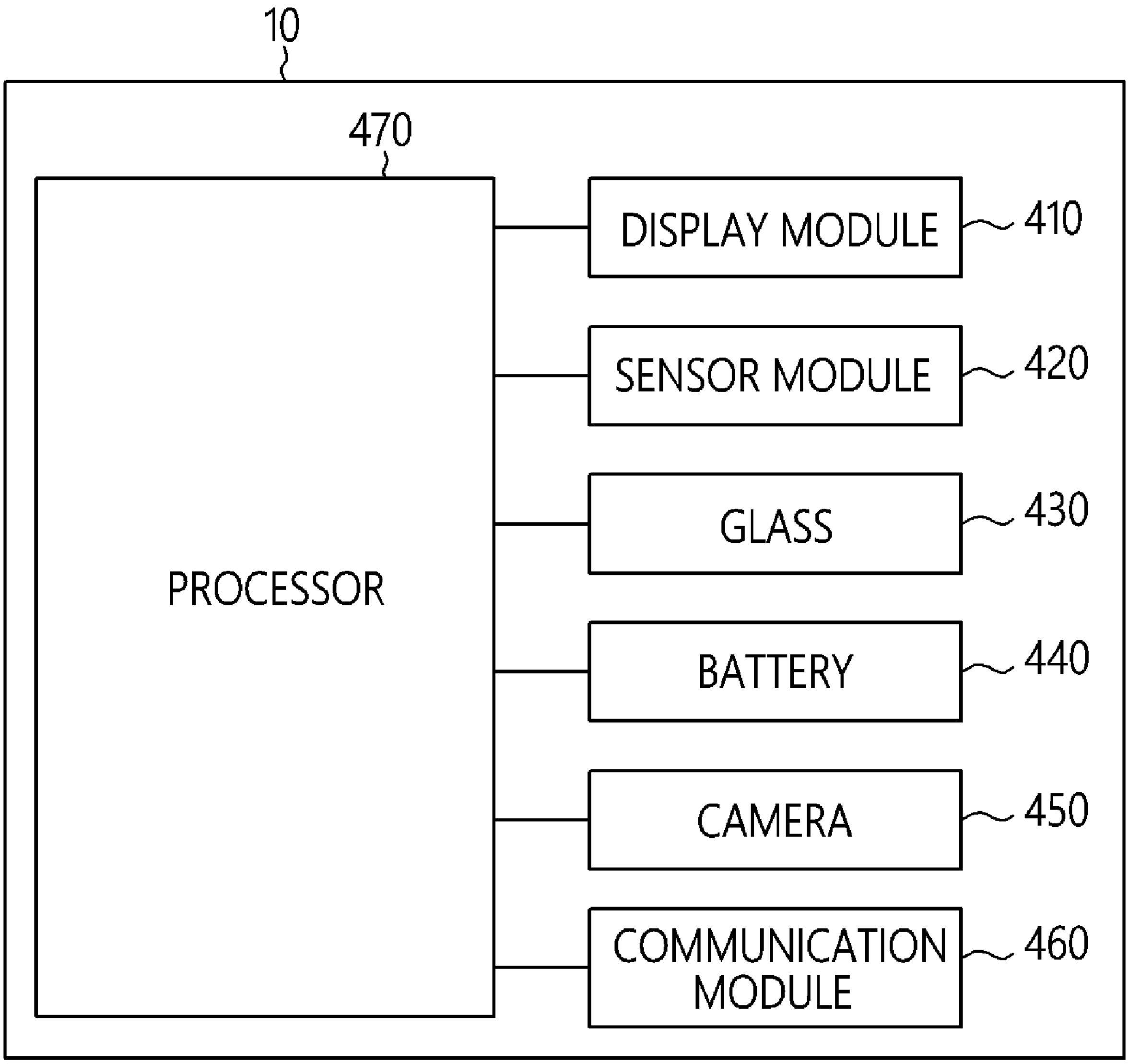
FIG. 4 is a block diagram of a display device according to an embodiment of the present disclosure.
Figure 5:
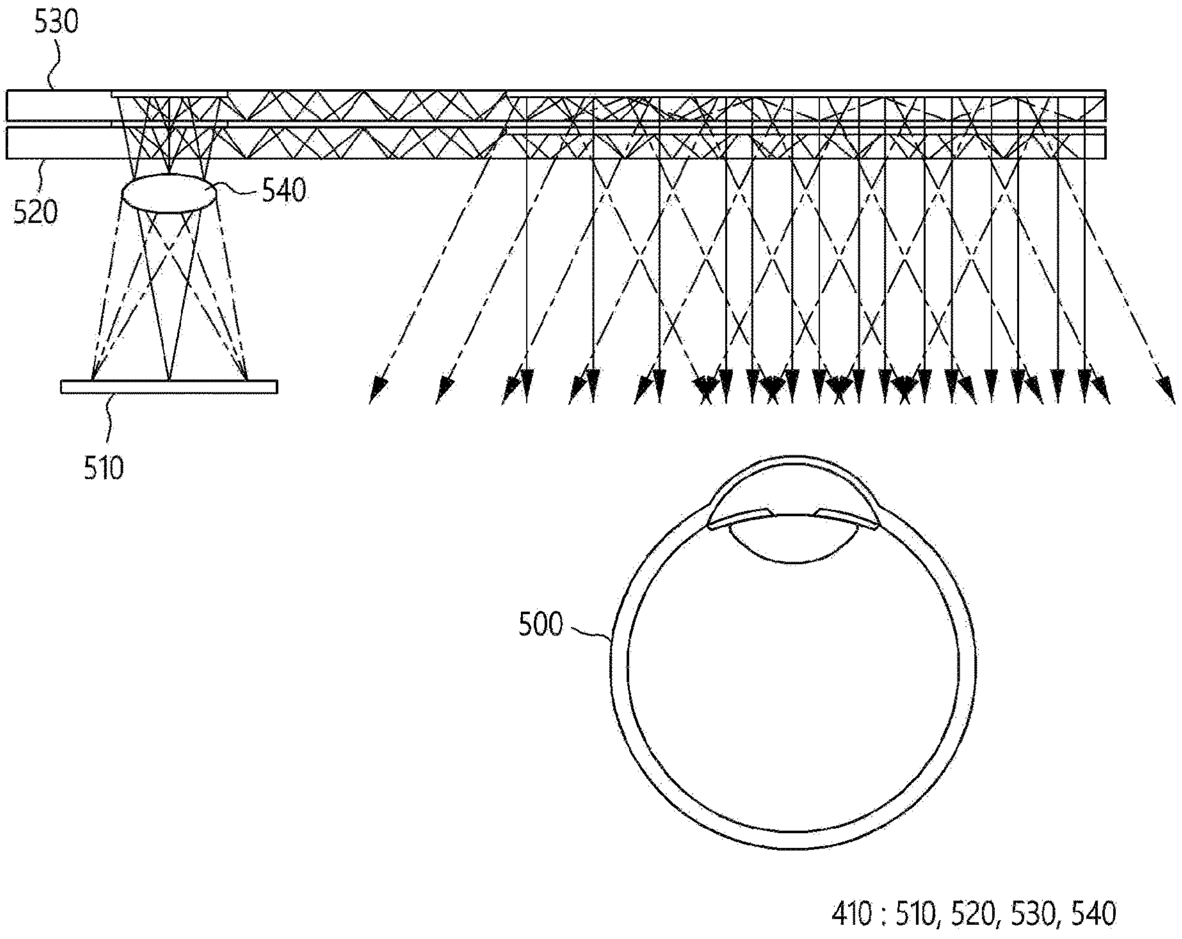
FIG. 5 is a view showing a configuration of a display module according to the embodiment.

FIG. 4 is a block diagram of a display device 10 according to an embodiment of the present disclosure. FIG. 5 is a view showing a configuration of a display module according to an embodiment. For example, FIG. 5 shows optical paths along which display lights output from a display panel 510 of the display device 10 move.

The display device 10 shown in FIGS. 4 and 5 may be applied to the HMD device shown in FIGS. 1 and 2 or the AR glasses shown in FIG. 3.

Referring to FIGS. 4 and 5, the display device 10 according to an embodiment may include a processor 470, a display module 410, a sensor module 420, glass 430, a battery 440, a camera 450, and a communication module

460. Although not shown in FIG. 4, the display device 10 may further include other elements described herein. In one or more embodiments, one or more of the elements shown in FIG. 4 may be omitted from the display device 10.

The processor 470 may execute instructions stored in a memory (not shown) to control operations of the elements of the display device 10 (e.g., the display module 410, the sensor module 420, the battery 440, the camera 450, and the communication module 460). The processor 470 may be electrically and/or operatively connected to the display module 410, the sensor module 420, the battery 440, the camera 450, and the communication module 460. The processor 470 may execute software to control at least one of the other elements connected to the processor 470 (e.g., the display module 410, the sensor module 420, the battery 440, the camera 450, and the communication module 460). The processor 470 may obtain instructions from the elements included in the display device 10, may interpret the obtained instructions, and may process and/or calculate various data based on the interpreted instructions.

The display device 10 may receive processed data from an external device (not shown) through the processor 470 incorporated into the external device (e.g., a smartphone or a tablet PC). For example, the display device 10 may capture an object (e.g., a real world object or a user's eye) through the camera 450 and may transmit the captured image to an external device via the communication module 460. The display device 10 may receive data based on the image captured by the display device 10 from an external device. The external device may generate image data associated with augmented reality based on the information of the captured object (e.g., shape, color, or location) received from the display device 10 and transmit the image data to the display device 10. The display device 10 may request additional information based on the image of the object (e.g., a real world object or a user's eye) captured through the camera 450 to an external device, and may receive additional information from the external device.

The display module 410 may include a display panel (e.g., the display panel 510 of FIG. 5), and light transmission members (e.g., waveguides 520 and 530) that transmit light exiting from the display panel 510 to a portion of the glass 430. Herein, the display panel 510 may refer to a light source unit that generates display lights input to the waveguides (e.g., 520 and 530 of FIG. 5). The display panel 510 may be a display panel to which OLEDOS (organic light emitting diode on silicon) technology is applied. For example, the display panel may include an OLED disposed on a semiconductor wafer substrate on which a complementary metal oxide semiconductor (CMOS) is disposed.

The display panel 510 of the display module 410 may emit display light for displaying an augmented reality image (or virtual reality image) under the control of the processor 470. For example, the display light emitted from the display panel 510 may be transferred to the display area of the lens (e.g., 200 in FIG. 2 or 200 in FIG. 3) through the waveguides 520 and 530, such that a user can see the display light. The display device 10 (e.g., the processor 470) may control the display panel 510 in response to a user's input. Types of user input may include button input, touch input, voice input, and/or gesture input; however, the present disclosure is not limited thereto. Various input means capable of controlling operation of the display panel 510 may be included.

The display device 10 may further include a light source (not shown) to track movement of a user's eye 500. The light source (not shown) may emit light different from display light output by the display panel 510. In an embodiment, the light source (not shown) may irradiate near-infrared light having an output wavelength of approximately 780 nm to 1400 nm to the user's eyes. The near-infrared light emitted from the light source (not shown) may be reflected off the user's eye 500, and the reflected near-infrared light may be input to the display panel 510. The display panel 510 may include an eye tracking sensor as an optical sensor for receiving near-infrared light reflected from the user's eye 500 and tracking the movement of the user's eye 500 using the input near-infrared light. In an embodiment, the eye tracking sensor may include a photodiode disposed in a sensor pixel (not shown) of the display panel 510.

When the display device 10 displays AR images or VR images, the display device 10 tracks movements of the user's eye using the photodiode and varies the resolution of the images based on the tracked movements of the user's eyes. For example, the display device 10 may detect the direction of the user's eyes and determine a central vision area in line with the eyes and a peripheral vision area excluding the central vision area. In an embodiment, the display device 10 may apply a foveated rendering technique that displays a high-resolution image in the central vision area and a low-resolution image in the peripheral vision area.

The glass 430 may be disposed in line with the display area of the lens (e.g., 200 in FIG. 2 or 200 in FIG. 3) of the wearable device. For example, the glass 430 may be included in each of the left eye lens (e.g., 210 in FIG. 2 or 210 in FIG. 3) and the right eye lens (e.g., 220 in FIG. 2 or 220 in FIG. 3).

In an embodiment, the glass 430 may include the waveguides 520 and 530 as reflective members. The waveguides 520 and 530 may include at least one of a display waveguide 520 and an eye tracking waveguide 530.

The display waveguide (e.g., a first waveguide) 520 may guide the display light exiting from the display panel 510 toward the display area of the lens (e.g., 200 in FIG. 2 or 200 in FIG. 3) to form light paths. For example, the display area of the lens (e.g., 200 in FIG. 2 or 200 in FIG. 3) may be an area where lights propagating inside the display waveguide 520 exit.

The display waveguide 520 may include at least one of at least one diffractive element or at least one reflective element (e.g., a reflective mirror). The display waveguide 520 may guide display light exiting from the display panel 510 to the user's eye 500 by using at least one diffractive element or reflective element included in the display waveguide 520. For example, the diffractive element may include an input/output grating, and the reflective element may include total internal reflection (TIR). An optical material (e.g., glass) may be processed into a wafer and used as the display waveguide 520. In an embodiment, a refractive index of the display waveguide 520 may be in a range from approximately 1.5 to 1.9.

In an embodiment, the display waveguide 520 may include a material (e.g., glass or plastic) that can totally reflect the display light in order to guide the display light to the user's eye 500. However, a material of the display waveguide 520 may not be limited to the above example.

The display waveguide 520 may split the display lights exiting from the display panel 510 by wavelength (e.g., blue, green, or red) and may allow them to travel in different paths, respectively, within the display waveguide 520.

The display waveguide 520 may be disposed on a portion of the glass 430. For example, the display waveguide 520 may be disposed at an upper end of the glass 430 with respect to a virtual axis in line with a center point of the glass 430 and a center point of the user's eye 500 and a virtual line perpendicular to the virtual axis and the center point of the glass 430. However, an area where the display waveguide 520 is disposed may not be limited to the above-described area of the glass 430. The display waveguide 520 may be disposed any area of the glass 430 as long as the amount of lights reflected off the user's eye 500 is equal to or greater than the reference value.

The sensor module 420 may include at least one sensor (e.g., an eye tracking sensor and/or an illuminance sensor). However, at least one sensor may not be limited to the above examples. For example, the at least one sensor may further include a proximity sensor or a contact sensor capable of detecting whether the display device 10 is worn by a user. In an embodiment, the display device 10 may detect whether the display device 10 is worn by a user through the proximity sensor or the contact sensor. If it is determined that the display device 10 is worn by a user, the display device 10 may manually and/or automatically pair with another electronic device (e.g., a smartphone).

The eye tracking sensor may detect reflected light reflected off the user's eye 500 under the control of the processor 470. The display device 10 may convert the reflected light detected through the eye tracking sensor into an electrical signal. The display device 10 may obtain an image of the user's eyes through the converted electrical signal. The display device 10 may track the user's eyes using the obtained image of the user's eyeballs.

The illuminance sensor may detect the luminance (or brightness) around the display device 10, the amount of display lights exiting from the display panel, the brightness around the user's eye 500, or the amount of reflected lights reflected off the user's eye 500 under the control of the processor 470.

The display device 10 may detect the luminance (or brightness) around the user using the illuminance sensor. The display device 10 may adjust the amount of lights (or brightness) of the display (e.g., the display panel 510) based on the detected luminance (or brightness).

The eye tracking waveguide (e.g., a second waveguide) 530 may guide lights reflected off the user's eye 500 such that they are input to the sensor module 420 to form light paths. The eye tracking waveguide 530 may be used to transfer the reflected lights to the eye tracking sensor. The eye tracking waveguide 530 may be formed of a same element as or a different element from the display waveguide 520.

The eye tracking waveguide 530 may be disposed on a portion of the glass 430. For example, the eye tracking waveguide 530 may be disposed at a lower end of the glass 430 with respect to a virtual axis in line with the center point of the glass 430 and the center point of the user's eye 500 and a virtual line perpendicular to the virtual axis and the center point of the glass 430. However, the location of the eye tracking waveguide 530 is not limited to the above-described location of the glass 430 and may be disposed any suitable area of the glass 430.

The battery 440 may supply power to at least one of the elements of the display device 10. The battery 440 may be charged by being wired or wirelessly connected to an external power source.

The camera 450 may capture an image around the display device 10. For example, the camera 450 may capture an image of the user's eye 500 or an image of a real world object outside the display device 10.

The communication module 460 may include a wired interface or a wireless interface. The communication module 460 may support direct communications (e.g., wired communications) or indirect communications (e.g., wireless communications) between the display device 10 and an external device (e.g., a smartphone or a tablet PC).

The communication module 460 may include a wireless communication module (e.g., a cellular communication module, a near-field wireless communication module, or a global navigation satellite system (GNSS) communication module, or a wired communication module (e.g., a local area network (LAN) communication module, or a power line communication module).

For example, the wireless communication module may support a 5G network after a 4G network and next-generation communication technologies, for example, NR (new radio) access technology. The NR access technology may support high-speed transmission of high-capacity data (enhanced mobile broadband (eMBB)), minimization or reduction of terminal power and access of multiple terminals (e.g., massive machine type communications (mMTC)), or high reliability and low latency (ultra-reliable and low latency (URLLC) communications). In an embodiment, the wireless communication module may support a high frequency band (e.g., mmWave band) to achieve a high data rate transmission, for example.

In an embodiment, the wireless communication module may include a near-field wireless communication module. Near-field communications may include at least one of: WiFi (wireless fidelity), Bluetooth, Bluetooth Low Energy (BLE), Zigbee, near-field communications (NFC), Magnetic Secure Transmission, radio frequency (RF), and body area network (BAN).

Referring to FIG. 5, the display module 410 includes the display panel 510 outputting display lights, the waveguides 520 and 530, and a projection lens 540.

The projection lens 540 may input light exiting from the display panel 510 to the waveguides 520 and 530. In the example shown in FIG. 5, a part of light flux exiting from the display panel 510 is input to the waveguides 520 and 530 through the projection lens 540.

The waveguides 520 and 530 may have a plate shape. The waveguides 520 and 530 may include grating having diffractive function, such as diffraction optical elements (DOE) and holographic optical elements (HOE), in a portion of the plate. The period, depth, or refractive index of the grating of the waveguides 520 and 530 may be varied or selected based on conditions such as the viewing angle of output images or the refractive index of a plate medium. The waveguides 520 and 530 may distribute optical signals input from the display panel 510 (i.e., display lights) such that some of the optical signals are transferred to the inside of the waveguide 430 while some others of the optical signals are output to the outside of the waveguide 520 and 530.

Although a diffractive optical element is described as an example of the waveguides 520 and 530 in the example shown in FIG. 5, the waveguides may be replaced with a reflective optical element, such as a beam splitter.

Figure 6:
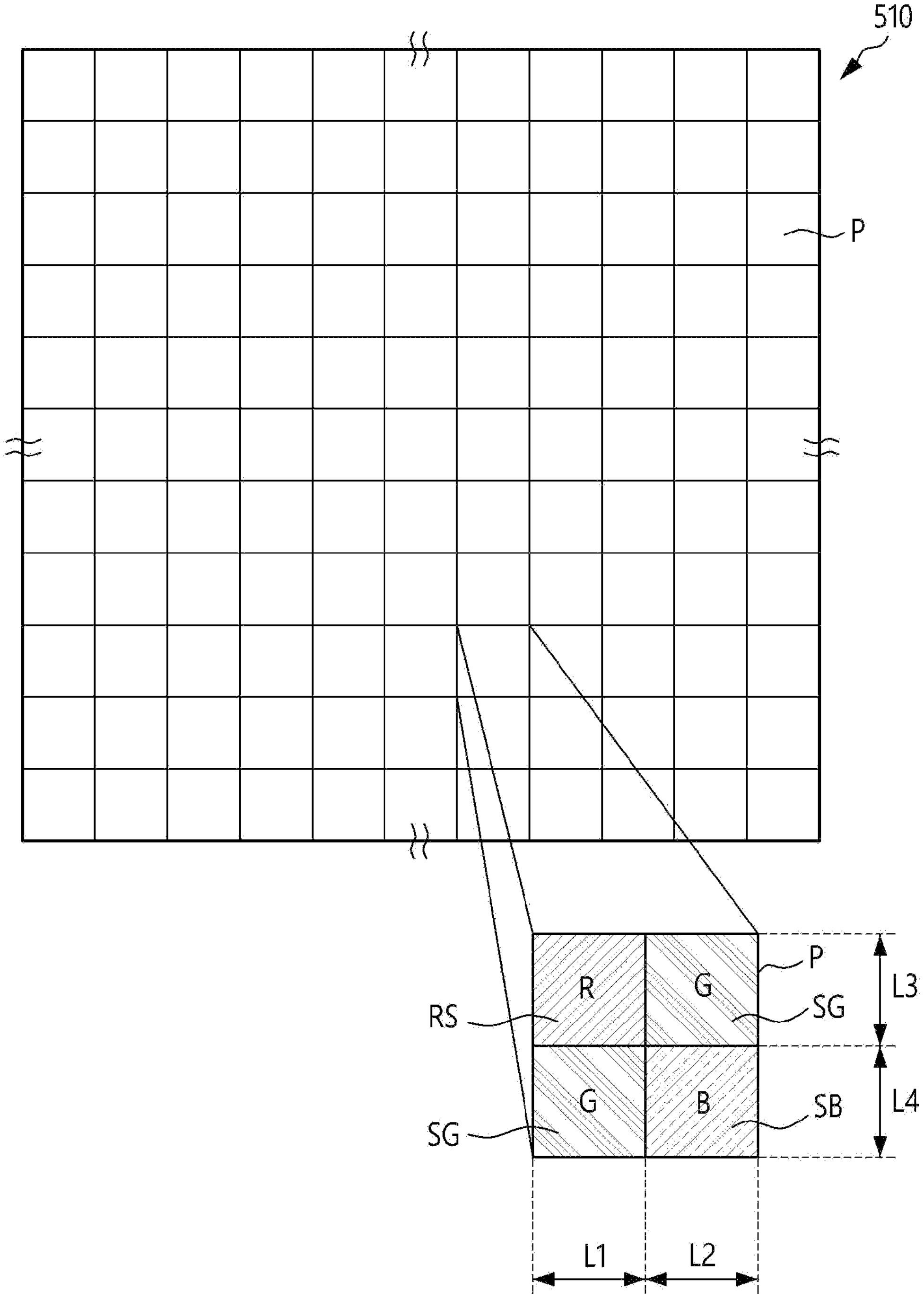
FIG. 6 is a schematic plan view of a display panel according to an embodiment of the present disclosure.

FIG. 6 is a schematic plan view of the display panel 510 according to an embodiment.

Referring to FIG. 6, the display panel 510 according to the embodiment may include a plurality of pixel groups P. The plurality of pixel groups P may be arranged in a matrix on a plane of the display panel 510. For example, the display panel 510 may include m*n pixel groups P (e.g., unit pixels), where each of m and n may be an integer greater than 1. As used herein, the sign * refers to the multiplication sign.

Each of the pixel groups P is divided into i*i sub-regions, and at least one first color pixel, second color pixel, and third color pixel may be disposed in the sub-regions. For example, the first color pixel may be a red pixel SR, the second color pixel may be a green pixel SG, and the third color pixel may be a blue pixel SB, where i may be an integer greater than 1. For example, one pixel group P includes 2*2 sub-regions, and one of a red pixel SR, a green pixel SG, and a blue pixel SB may be disposed in each of the sub-regions. In an embodiment, the red pixel SR, the green pixel SG, and the blue pixel SB may have substantially a same area.

In an embodiment, a ratio of horizontal width to vertical width of each of the red pixel SR, the green pixel SG, and the blue pixel SB may be 1:1. A horizontal width of one column in which a red pixel SR and a green pixel SG are arranged has a first length L1, a horizontal width of two columns in which a green pixel SG and a blue pixel SB are arranged has a second length L2, a vertical width of one row in which the red pixel SR and the green pixel SG are arranged has a third length L3, and a vertical width of the second row in which the green pixel SG and blue pixel SB are arranged has a fourth length L4. In an embodiment, the first length L1, the second length L2, the third length L3, and the fourth length L4 may all be equal. Although the ratio of horizontal width to vertical width of each of the red pixel SR, the green pixel SG, and the blue pixel SB is 1:1 in the example shown in FIG. 6, the present disclosure is not limited thereto. For example, the red pixel SR, the green pixel SG, and the blue pixel SB may have different areas, and may have different ratios of horizontal width to vertical width. In this instance, at least some among the first length L1, the second length L2, the third length L3, and the fourth length L4 may have different values.

Although one pixel group P includes one red pixel SR, two green pixels SG and one blue pixel SB in the example shown in FIG. 6, the arrangement of pixels included in each pixel group P may be variously changed. For example, each pixel group P may include at least one red pixel SR, at least one green pixel SG, and at least one blue pixel SB.

Figure 7:
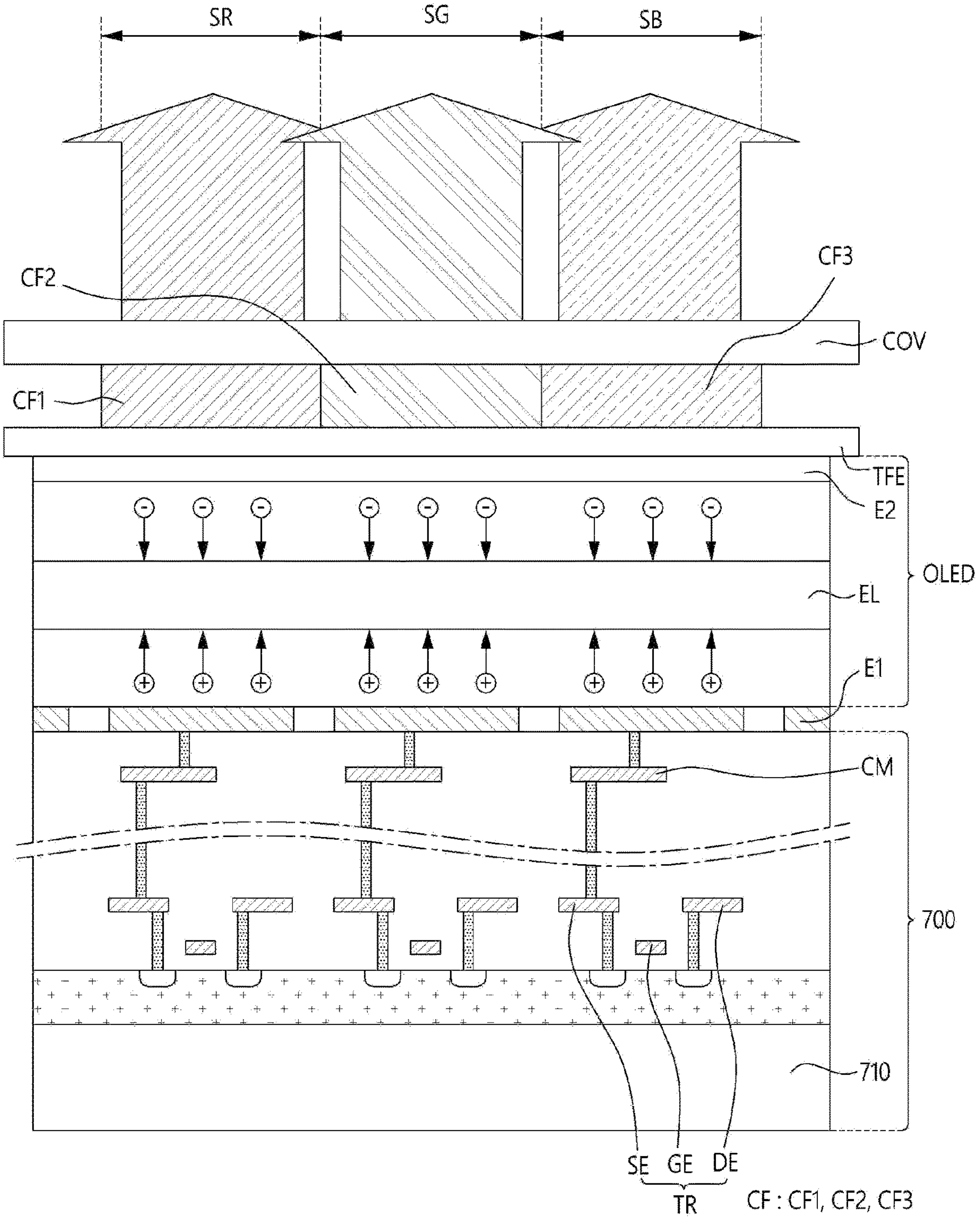
FIG. 7 is a cross-sectional view showing an emission area of a display panel according to an embodiment of the present disclosure.

FIG. 7 is a cross-sectional view showing an emission area of the display panel 510 according to an embodiment.

Referring to FIG. 7, in an embodiment, the red pixel SR includes a red color filter CF1 and thus emits red light as the red color filter CF1 transmits the red light. According to another embodiment, an emissive layer EL of a red pixel SR may directly emit red light, and the red color filter CF1 may be omitted.

In an embodiment, the green pixel SG includes a green color filter CF2 and emits green light as the green color filter CF2 transmit the green light. According to another embodiment, an emissive layer EL of a green pixel SG may directly emit green light, and the green color filter CF2 may be omitted.

In an embodiment, the blue pixel SB includes a blue color filter CF3 and emits blue light as the blue color filter CF3 transmit the blue light. According to another embodiment, an emissive layer EL of a blue pixel SB may directly emit blue light, and the blue color filter CF3 may be omitted.

Although not shown in the drawings, the display panel 510 may further include a sensor pixel (not shown). The sensor pixel may include a photodiode (not shown), and may detect reflected light reflected off the user's eye 500. The photodiode may convert the detected reflected light into an electrical signal to supply the converted electrical signal to the sensor module 420. Such a sensor pixel may track the movement of the user's eyes.

Referring to FIG. 7, the display panel 510 may include a semiconductor wafer substrate 700, an OLED disposed on the semiconductor wafer substrate 700, and color filters CF: CF1, CF2, and CF3 disposed on the OLED. An encapsulation layer TFE covering the emissive layer EL of the OLED may be disposed between the OLED and the color filters CF: CF1, CF2, and CF3. A cover window COV may be disposed on the color filters CF: CF1, CF2 and CF3. The cover window COV may be attached to the color filters CF: CF1, CF2 and CF3 by a transparent adhesive member (not shown) such as an optically clear adhesive (OCA) film.

The semiconductor wafer substrate 700 may include a base substrate 710 and a transistor TR disposed on the base substrate 710.

The base substrate 710 may be a silicon substrate. The base substrate 710 may have a semiconductor pattern formed on a silicon substrate. For example, the base substrate 710 may be a silicon semiconductor substrate formed via a complementary metal oxide semiconductor (CMOS) process. The base substrate 710 may include one of a monocrystalline silicon wafer, a polycrystalline silicon wafer, and/or an amorphous silicon wafer.

The transistor TR disposed on the base substrate 710 may include a gate electrode GE, a source electrode SE, and a drain electrode DE. The transistor TR may independently control the red pixel SR, the green pixel SG, and the blue pixel SB included in each of the pixel groups P. A connection electrode CM electrically connected to the transistor TR, conductive lines (not shown), and conductive pads (not shown) may be further disposed on the base substrate 710. The connection electrode CM, the conductive lines, and the conductive pads may include a conductive material, for example, a metal material.

An OLED including first electrodes E1, an emissive layer EL and a second electrode E2 may be disposed on the semiconductor wafer substrate 700.

The first electrodes E1 may be electrically connected to the transistor TR through the connection electrode CM of the semiconductor wafer substrate 700 and at least one contact hole connected thereto. The first electrodes E1 may be anode electrodes for driving the emissive layer EL of each of the red pixel SR, the green pixel SG, and the blue pixel SB. The first electrodes E1 may be reflective electrodes. For example, the first electrodes E1 may reflect light emitted from the emissive layer EL downward. The first electrodes E1 may include a metal material having high light reflectivity. For example, the first electrodes E1 may include one of Al, Al/Cu, and Al/TiN.

The emissive layer EL may be disposed on the first electrodes E1. The emissive layer EL may include a single layer or multi-layer structure. In an embodiment, the emissive layer EL may emit white light. For example, the white light may be a mixture of blue light, green light, and red light. In another embodiment, the white light may be a mixture of blue light and yellow light. According to another embodiment, the emissive layer EL may emit a color light instead of white light. For example, the emissive layer EL may emit red light from the red pixel SR, may emit green light from the green pixel SG, and may emit blue light from the blue pixel SR. In the following description, the emissive layer EL emits white light for convenience of illustration.

The second electrode E2 may be disposed on the emissive layer EL. The second electrode E2 is a common electrode and may be, for example, a cathode electrode. The second electrode E2 may be a transmissive or transflective electrode. For example, the second electrode E2 may transmit light emitted from the emissive layer EL. The second electrode E2 may include a conductive material. For example, the second electrode E2 may include Li, Ca, LiF/Ca, LiF/Al, Al, Mg, BaF, Ba, Ag, Au, Cu, which has a low work function, or a compound or mixture thereof.

The thin-film encapsulation layer TFE may be disposed on the OLED. The encapsulation layer TFE may encapsulate the emissive layer EL to prevent or substantially prevent permeation of oxygen or moisture into the emissive layer EL. The encapsulation layer TFE may be disposed on top and side surfaces of the emissive layer EL. The encapsulation layer TFE may include at least one inorganic film to prevent or substantially prevent permeation of oxygen or moisture into the emissive layer EL. In an embodiment, the encapsulation layer TFE may include at least one organic film to protect the emissive layer EL from particles such as dust. The encapsulation layer TFE may be made up of multiple layers in which one or more inorganic layers of a silicon nitride layer, a silicon oxynitride layer, a silicon oxide layer, a titanium oxide layer, and an aluminum oxide layer are alternately stacked on one another. In an embodiment, the encapsulation layer TFE may include an acryl resin, an epoxy resin, a phenolic resin, a polyamide resin, or a polyimide resin.

The color filters CF: CF1, CF2, and CF3 may be disposed on the encapsulation layer TFE. The color filters CF: CF1, CF2, and CF3 may include a red color filter CF1 that transmits red light (e.g., a first color filter), a green color filter CF2 that transmits green light (e.g., a second color filter), and a blue color filter CF3 that transmits blue light (e.g., a third color filter). The red color filter CF1 may be disposed in line with the red pixel SR, and may transmit red light among white light emitted from the emissive layer EL of the red pixel SR. The green color filter CF2 may be disposed in line with the green pixel SG, and may transmit green light among white light emitted from the emissive layer EL of the green pixel SG. The blue color filter CF3 may be disposed in line with the blue pixel SB, and may transmit blue light among white light emitted from the emissive layer EL of the blue pixel SB.

In an embodiment, the display panel 510 applied to the wearable device 100 such as an HMD device or AR glasses is designed to have an ultra-high resolution of at least 2,000 pixels per inch (PPI). Accordingly, the front emission efficiency of the display panel 510 (e.g., the upper side in FIG. 7) is important. According to an embodiment of the present disclosure, a light control pattern layer LCP (see FIG. 8) is disposed on the OLED to improve the front emission efficiency. Herein, "the front emission efficiency" may mean that the intensity of light exiting from the upper surface of the display panel 510 in a vertical direction is relatively high. For example, as the front emission efficiency increases, the intensity of light exiting from the upper surface of the display panel 510 in the vertical direction may be higher than the intensity of light exiting from the upper surface of the display panel 510 in a viewing angle direction having an acute angle to the upper surface of the display panel 510.

Herein, the light control pattern layer LCP of an embodiment of the present disclosure increases the front emission efficiency and will be described in further detail with reference to FIGS. 8 to 14.

Figure 8:
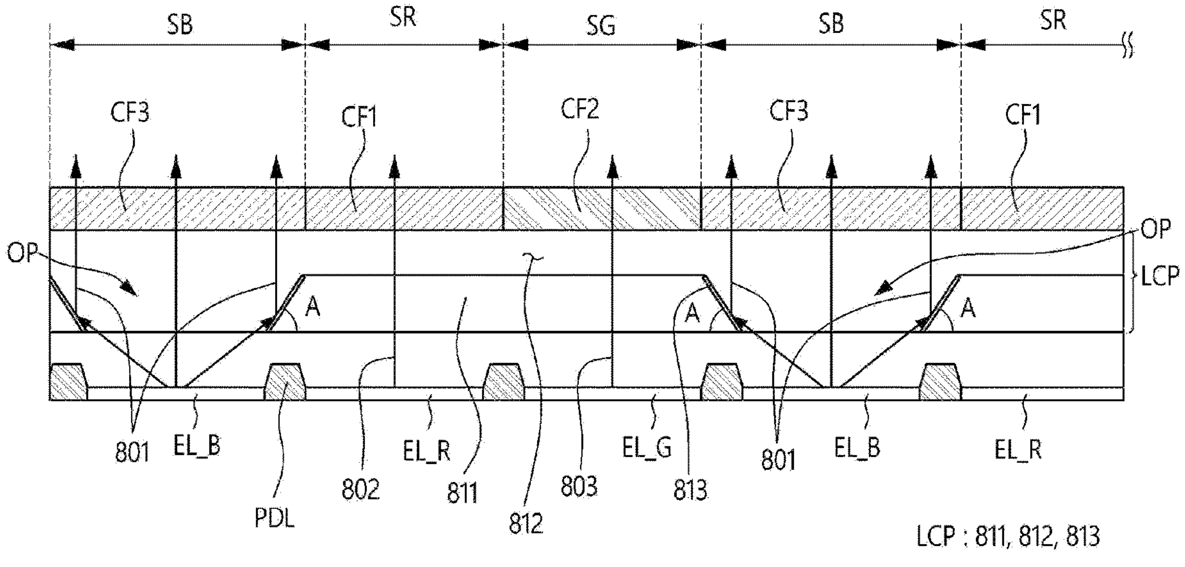
FIG. 8 is a cross-sectional view showing a light control pattern layer according to an embodiment of the present disclosure.

FIG. 8 is a cross-sectional view showing a light control pattern layer LCP according to an embodiment. For example, FIG. 8 may be a cross-sectional view showing a part of the OLED shown in FIG. 7 and features stacked thereon.

In FIG. 8, emissive layers EL: EL_R, EL_G, and EL_B of an OLED disposed on the semiconductor wafer substrate 700 are shown. For example, the emissive layers EL: EL_R, EL_G, and EL_B may include a first emissive layer EL_R disposed in line with the red pixel SR, a second emissive layer EL_G disposed in line with the green pixel SG, and a third emissive layer EL_B disposed in line with the blue pixel SB.

Each of the first emissive layer EL_R, the second emissive layer EL_G, and the third emissive layer EL_B may include a single layer or multi-layer structure. In an embodiment, each of the first emissive layer EL_R, the second emissive layer EL_G, and the third emissive layer EL_B may emit white light. For example, the white light may be a mixture of blue light, green light, and red light. In another embodiment, the white light may be a mixture of blue light and yellow light. According to another embodiment, each of the first emissive layer EL_R, the second emissive layer EL_G, and the third emissive layer EL_B may emit a color light instead of white light. For example, the first emissive layer EL_R may emit red light, the second emissive layer EL_G may emit green light, and the third emissive layer EL_B may emit blue light. In the following description, each of the first emissive layer EL_R, the second emissive layer EL_G, and the third emissive layer EL_B is described as emitting white light for convenience of illustration.

The areas of the first emissive layer EL_R, the second emissive layer EL_G, and the third emissive layer EL_B may be divided by a pixel-defining film PDL. The pixel-defining film PDL may also be referred to as a bank and defines emission areas of the display panel 510. In an embodiment, the pixel-defining film PDL may be formed to expose each of the first electrodes E1 and may cover an edge of each of the first electrodes E1. The pixel-defining film PDL may be formed of an organic layer, such as any of an acryl resin, an epoxy resin, a phenolic resin, a polyamide resin, and a polyimide resin.

Although not shown in the drawings, a spacer may be disposed on the pixel-defining film PDL. The spacer may support a mask during a process of fabricating the emissive layers EL: EL_R, EL_G, and EL_B. The spacer may be formed of an organic layer such as any of an acryl resin, an epoxy resin, a phenolic resin, a polyamide resin, and a polyimide resin.

The encapsulation layer TFE described above with reference to FIG. 7 may be disposed on the emissive layers EL: EL_R, EL_G, and EL_B. The light control pattern layer LCP may be disposed on the encapsulation layer TFE to improve the front emission efficiency. For example, the light control pattern layer LCP may be disposed between the encapsulation layer TFE covering the emissive layers EL: EL_R, EL_G, and EL_B and the color filters CF: CF1, CF2, and CF3. If each of the first emissive layer EL_R, the second emissive layer EL_G, and the third emissive layer EL_B emits a color light instead of white light, the light control pattern layer LCP may be disposed between the encapsulation layer TFE covering the emissive layers and the cover window COV. This is because the color filters CF: CF1, CF2, and CF3 may be omitted when each of the first emissive layer EL_R, the second emissive layer EL_G, and the third emissive layer EL_B emits a color light instead of white light.

The light control pattern layer LCP may include an organic film pattern 811 and a planarization film 812 covering an upper surface of the encapsulation layer TFE including the organic film pattern 811.

The organic film pattern 811 is a transparent organic film and forms openings OP corresponding to some pixels, thereby improving the front emission efficiency of the pixels in line with the openings OP. For example, the organic film pattern 811 may be disposed in some of the pixels of the display panel 510 and not in other pixels, to form the openings OP. In an embodiment, for example, the display panel 510 includes a first color pixel, a second color pixel, and a third color pixel, and the organic film pattern 811 is not disposed in the first color pixel and is disposed in the second color pixel and the third color pixel. In this instance, the organic film pattern 811 may form the opening OP in line with the first color pixel.

The planarization film 812 may be disposed to cover the organic film pattern 811 and the openings OP. The planarization film 812 may be formed of an organic layer, such as any of an acryl resin, an epoxy resin, a phenolic resin, a polyamide resin, and a polyimide resin.

A pixel in which an opening OP of the organic film pattern 811 is formed may be a pixel having the lowest emission efficiency among the pixels of various colors included in each of the pixel groups P. For example, as described above with reference to FIG. 6, each of the pixel groups P of the display panel 510 may include at least one first color pixel, second color pixel, and third color pixel, and a pixel in which the opening OP of the organic film pattern 811 is formed may be one having the lowest emission efficiency among them. As used herein, "emission efficiency" may refer to the luminance of light output per unit area. For example, if the red pixel SR and the blue pixel SB have the same area and the luminance of light emitted from the blue pixel SB is lower than the luminance of light emitted from the red pixel SR, the emission efficiency of the blue pixel SB is lower than that of the red pixel SR. Alternatively, the "emission efficiency" may refer to relative intensity of light of a specific color in each of the pixel groups P. For example, if a pixel group P includes at least one first color pixel, at least one second color pixel, and at least one third color pixel, and the light from the first color generated by the first color pixel is the weakest, the emission efficiency of the first color pixel is the lowest.

Therefore, according to an embodiment of the present disclosure, one of the first color pixel, the second color pixel, and the third color pixel may be selected which has the lowest emission efficiency. In addition, by forming the opening OP of the organic film pattern 811 in line with the selected pixel, the emission efficiency of the selected pixel is increased. In FIG. 8, the blue pixel SB is shown as a first color pixel forming an opening OP of the organic film pattern 811, a red pixel SR is designated as a second color pixel, and a green pixel SG is designated as a third color pixel. Accordingly, in the example shown in FIG. 8, the blue pixels SB have emission efficiency lower than the red pixels SR and the green pixels SR and, thus, the openings OP of the organic film pattern 811 are formed in the blue pixels SB. It should be understood, however, that although the blue pixels SB are shown as the first color pixels forming the openings OP of the organic layer pattern 811, this is merely illustrative.

Referring to FIG. 8, a side surface of the organic film pattern 811 forming an opening OP in a blue pixel SB, which is a first color pixel, includes a slope inclined at an angle (e.g., a predetermined angle). In an embodiment, a metal material 813 to reflect light is disposed on the slope of the organic film pattern 811. The metal material 813 may reflect the light that was emitted from the emissive layer of the blue pixel SB that is a first color pixel, e.g., the third emissive layer EL_B and travels toward the slope to the front side of the display panel 510 (e.g., the upper side of FIG. 8). For example, arrows 801 in FIG. 8 indicate that some of the white light that is emitted from the third emissive layer EL_B in line with the blue pixel SB and travels toward the slopes is reflected toward the front surface of the display panel 510. As such, the side surfaces of the organic film pattern 811 forming the openings OP may form reflective partition walls inclined at an angle (e.g., a predetermined angle). It should be understood, however, that the reflective partition walls using the metal material 813 may be omitted in a method of adjusting refractive indices of the organic film pattern 811 and the planarization film 812, as will be described later with reference to FIG. 14.

On the other hand, as shown by an arrow 802 in FIG. 8, light exiting from the red pixel SR, which is a second color pixel overlapping the organic film pattern 811, passes through the organic film pattern 811 and the planarization film 812 to travel toward the front side of the display panel 510. In addition, as shown by an arrow 803 in FIG. 8, light exiting from the green pixel SG, which is a third color pixel overlapping the organic film pattern 811, passes through the organic film pattern 811 and the planarization film 812 to travel toward the front side of the display panel 510.

The light exiting from the blue pixel SB, which is a first color pixel, may have blue light after it passes through the third color filter CF3. The light exiting from the red pixel SR, which is a second color pixel, may have red light after it passes through the first color filter CF1. In addition, the light exiting from the green pixel SG, which is a third color pixel, may have green light after it passes through the second color filter CF2.

In FIG. 8, an angle A of the side surface of the organic film pattern 811 disposed adjacent to the opening of the organic film pattern 811 may be, but is not limited to, approximately 70 degrees. For example, the angle A of the side surface of the organic film pattern 811 may be selected such that light emitted from the emissive layer of a first color pixel toward the side surface of the organic film pattern 811 may be directed toward the front side of the display panel 510.

As described above, according to an embodiment of the present disclosure, the organic film pattern 811 forming the openings OP is formed in some pixels having low emission efficiency in the display panel 510 that is designed to have ultra-high resolution of approximately 2,000 pixels per inch (PPI) or more, such that it is possible to increase the front emission efficiency. In addition, according to an embodiment of the present disclosure, the light control pattern layer LCP is disposed, such that it is possible to prevent or substantially prevent light leakage such as screen door effect that allows the pixel-defining film PDL to be recognized.

Figure 9:
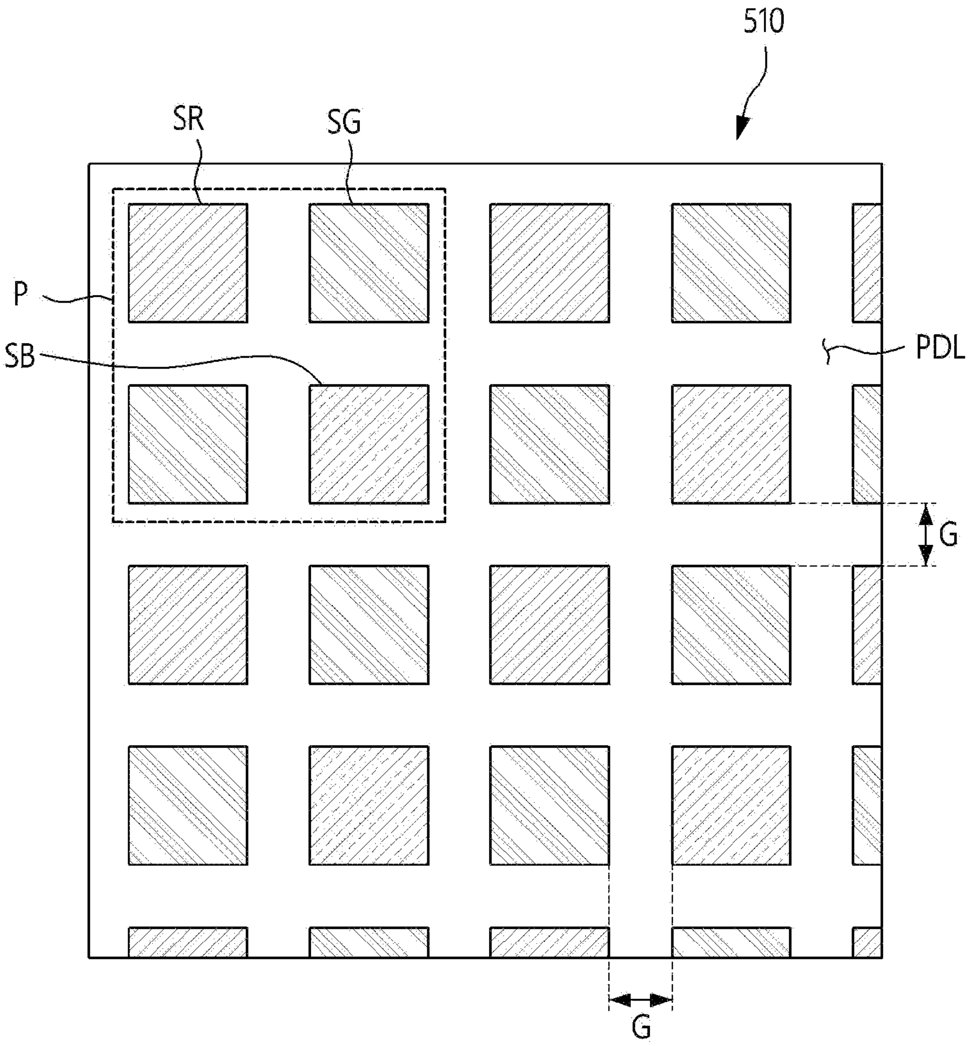
FIG. 9 is an enlarged plan view of a part of the display panel shown in FIG. 6.
Figure 10:
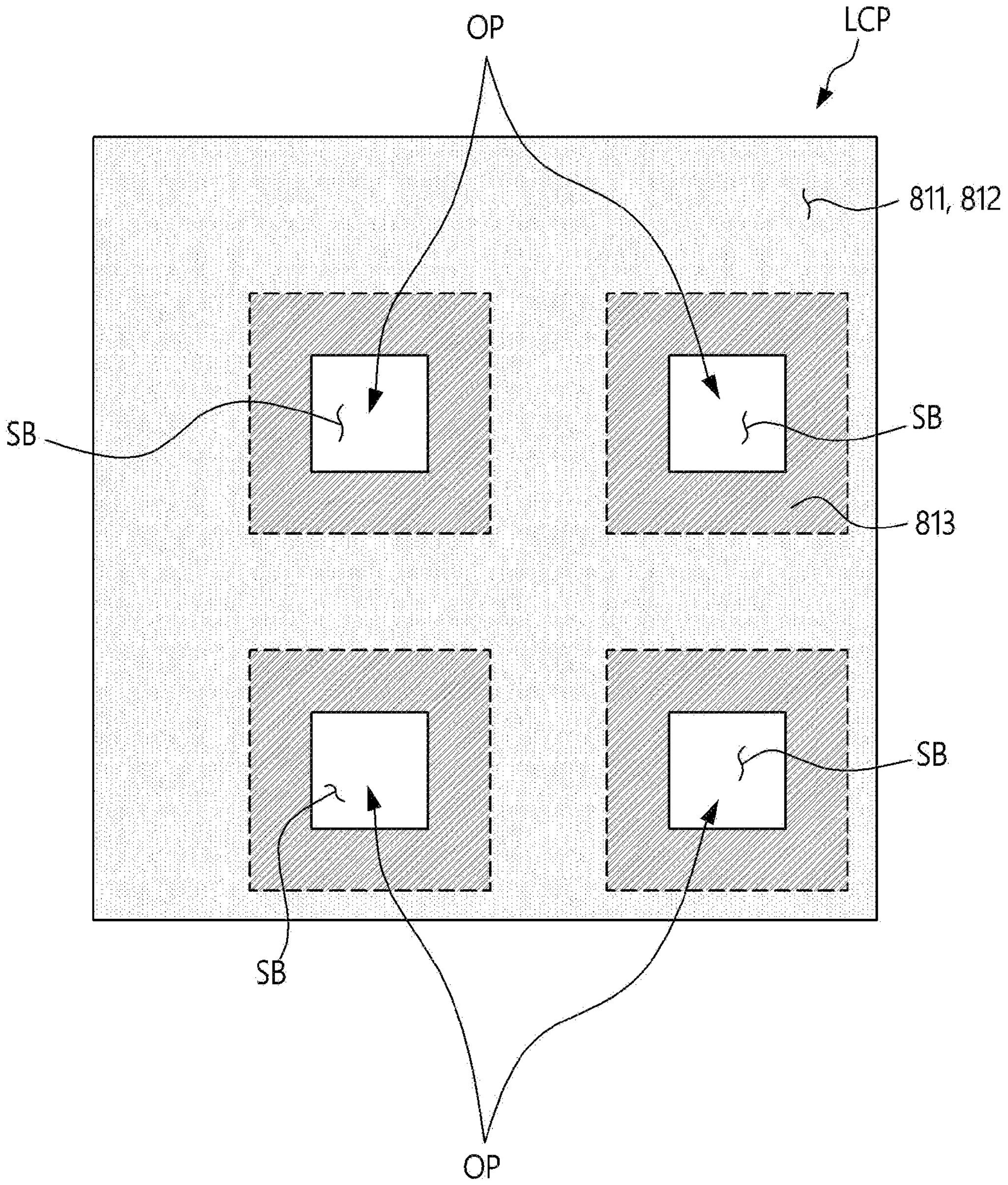
FIG. 10 is a plan view showing a portion of the light control pattern layer shown in FIG. 8.
Figure 11:
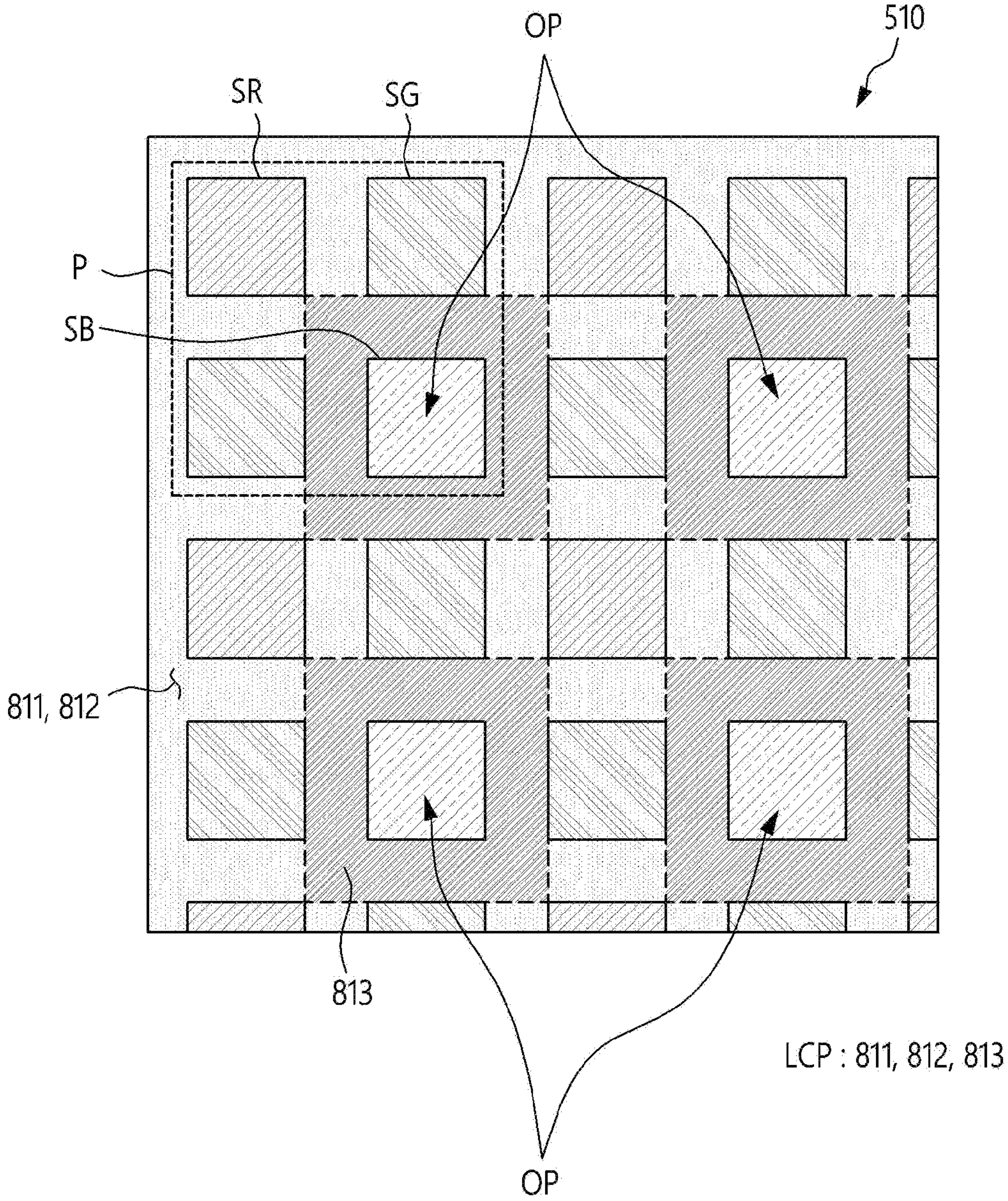
FIG. 11 is a plan view showing a part of the display panel in which the light control pattern layer is stacked on the OLED.

FIG. 9 is an enlarged plan view of a part of the display panel 510 shown in FIG. 6. For example, FIG. 9 may be an enlarged plan view of at least a portion of the display panel 510 shown in FIG. 6. FIG. 10 is a plan view showing a portion of the light control pattern layer LCP shown in FIG. 8. FIG. 11 is a plan view showing a part of the display panel 510 in which the light control pattern layer LCP is stacked on the OLED.

Referring to FIG. 9, a plurality of pixel groups P may be arranged in a matrix in the display panel 510. Each of the pixel groups P may include at least one red pixel SR, at least one green pixel SG, and at least one blue pixel SB. In the example shown in FIG. 9, one pixel group P includes one red pixel SR, two green pixels SG, and one blue pixel SB, and the blue pixel SB has the lowest emission efficiency in the one pixel group P.

As shown in FIG. 9, each of the pixels of the display panel 510 may be partitioned by a pixel-defining film PDL. For example, the pixel-defining film PDL is disposed between the pixels of the display panel 510 to define the emission areas of the display panel 510. The pixel-defining film PDL may have a gap (e.g., a predetermined gap) G between the pixels. In an embodiment, a width of the gap G of the pixel-defining film PDL is reduced in order to meet the design conditions for the display panel 510 to have an ultra-high resolution of approximately 2,000 pixels per inch (PPI) or more. According to an embodiment of the present disclosure, by providing the light control pattern layer LCP, the design margin for the gap G of the pixel-defining film PDL can be increased, and high image quality can be achieved by preventing or substantially preventing color mixing.

Referring to FIGS. 10 and 11, the light control pattern layer LCP may include an organic film pattern 811 including openings OP in line with blue pixels SB that are first color pixels. The openings OP of the organic film pattern 811 may be disposed in line with the blue pixels SB, and the pixels other than the blue pixels SB may be covered by the organic film pattern 811.

In an embodiment, side surfaces of the organic film pattern 811 forming the openings OP in the blue pixels SB include slopes inclined at an angle (e.g., a predetermined angle). In an embodiment, a metal material 813 to reflect light is disposed on the slopes of the organic film pattern 811. The metal material 813 may reflect the light that was emitted from the emissive layer of the blue pixel SB that is a first color pixel, e.g., the third emissive layer EL_B and travels toward the slope to the front side of the display panel 510 (e.g., the upper side of FIG. 8).

Although the planarization film 812 of the light control pattern layer LCP covering the organic film pattern 811 and the openings OP is not shown in FIGS. 10 and 11, the light control pattern layer LCP may further include the planarization film 812.

Figure 12:
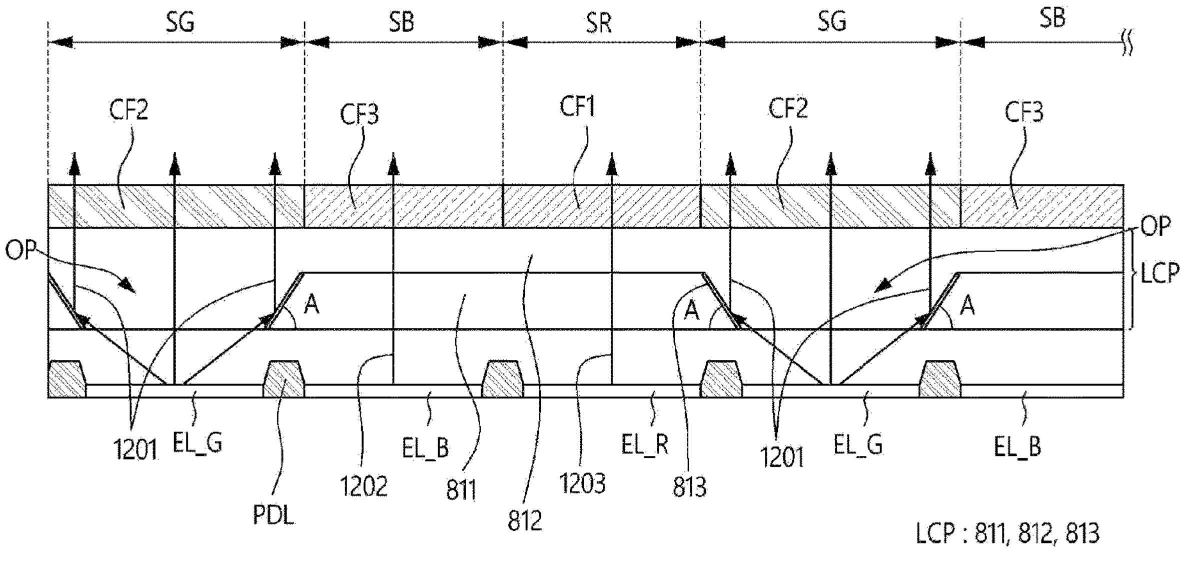
FIG. 12 is a cross-sectional view showing a light control pattern layer according to another embodiment of the present disclosure.

FIG. 12 is a cross-sectional view showing a light control pattern layer LCP according to another embodiment of the present disclosure.

The embodiment of FIG. 12 is substantially the same as the embodiment of FIG. 8; and, therefore, redundant descriptions may be omitted.

The embodiment of FIG. 12 is different from the embodiment of FIG. 8 in that green pixels SG are designated as first color pixels. For example, a green pixel SG is shown as a first color pixel forming an opening OP of the organic film pattern 811, a blue pixel SB is designated as a second color pixel, and a red pixel SR is designated as a third color pixel. Accordingly, in the example shown in FIG. 12, the green pixels SG have emission efficiency lower than the blue pixels SB and the red pixels SR and, thus, the openings OP of the organic film pattern 811 are formed in the green pixels SG.

Referring to FIG. 12, a side surface of the organic film pattern 811 forming an opening OP in a green pixel SG, which is a first color pixel, includes a slope inclined at an angle (e.g., a predetermined angle). In an embodiment, a metal material 813 to reflect light is disposed on the slopes of the organic film pattern 811. The metal material 813 may reflect the light that was emitted from the emissive layer of the green pixel SG that is a first color pixel, e.g., the second emissive layer EL_G, and travels toward the slope to the front side of the display panel 510 (e.g., the upper side of FIG. 12). For example, arrows 1201 in FIG. 12 indicate that some of the white light that is emitted from the second emissive layer EL_G in line with the green pixel SG and travels toward the slopes is reflected toward the front surface of the display panel 510. It should be understood, however, that the reflective partition walls using the metal material 813 may be omitted in a method of adjusting refractive indices of the organic film pattern 811 and the planarization film 812, as will be described later with reference to FIG. 14.

On the other hand, as shown by an arrow 1202 in FIG. 12, light exiting from the blue pixel SB, which is a second color pixel overlapping the organic film pattern 811, passes through the organic film pattern 811 and the planarization film 812 to travel toward the front side of the display panel 510. In addition, as shown by an arrow 1203 in FIG. 12, light exiting from the red pixel SR, which is a third color pixel overlapping the organic film pattern 1203, passes through the organic film pattern 811 and the planarization film 812 to travel toward the front side of the display panel 510.

Figure 13:
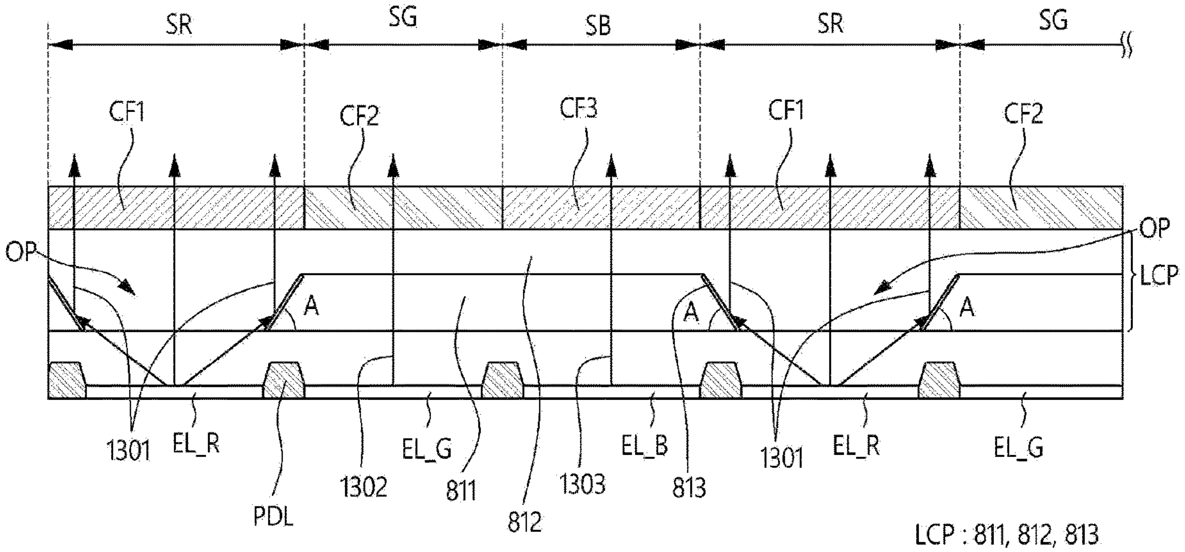
FIG. 13 is a cross-sectional view of a light control pattern layer according to another embodiment of the present disclosure.

FIG. 13 is a cross-sectional view showing a light control pattern layer LCP according to another embodiment of the present disclosure.

The embodiment of FIG. 13 is substantially the same as the embodiment of FIG. 8; and, therefore, redundant descriptions may be omitted.

The embodiment of FIG. 13 is different from the embodiment of FIG. 8 in that red pixels SR are designated as first color pixels. For example, a red pixel SR is shown as a first color pixel forming an opening OP of the organic film pattern 811, a green pixel SG is designated as a second color pixel, and a blue pixel SB is designated as a third color pixel. Accordingly, in the example shown in FIG. 13, the red pixels SR have emission efficiency lower than the green pixels SG and the blue pixels SB and, thus, the openings OP of the organic film pattern 811 are formed in the red pixels SR.

Referring to FIG. 13, a side surface of the organic film pattern 811 forming an opening OP in a red pixel SR, which is a first color pixel, includes a slope inclined at an angle (e.g., a predetermined angle). In an embodiment, a metal material 813 to reflect light is disposed on the slopes of the organic film pattern 811. The metal material 813 may reflect the light that was emitted from the emissive layer of the red pixel SR that is a first color pixel, e.g., the first emissive layer EL_R and travels toward the slope to the front side of the display panel 510 (e.g., the upper side of FIG. 13). For example, arrows 1301 in FIG. 13 indicate that some of the white light that is emitted from the first emissive layer EL_R in line with the red pixel SR and travels toward the slopes is reflected toward the front surface of the display panel 510. It should be understood, however, that the reflective partition walls using the metal material 813 may be omitted in a method of adjusting refractive indices of the organic film pattern 811 and the planarization film 812, as will be described later with reference to FIG. 14.

On the other hand, as shown by an arrow 1302 in FIG. 13, light exiting from the green pixel SG, which is a second color pixel overlapping the organic film pattern 811, passes through the organic film pattern 811 and the planarization film 812 to travel toward the front side of the display panel 510. In addition, as shown by an arrow 1303 in FIG. 13, light exiting from the blue pixel SB, which is a third color pixel overlapping the organic film pattern 1303, passes through the organic film pattern 811 and the planarization film 812 to travel toward the front side of the display panel 510.

Figure 14:
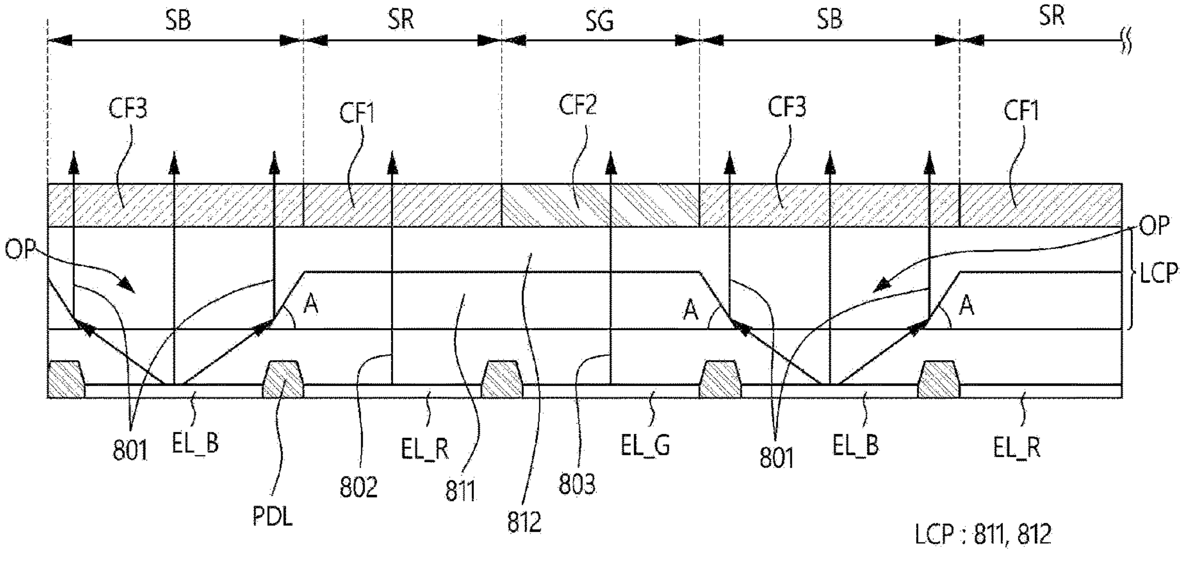
FIG. 14 is a cross-sectional view showing a light control pattern layer in which reflective partition walls are not present.

FIG. 14 is a cross-sectional view showing a light control pattern layer LCP without the reflective partition walls using the metal material 813.

The embodiment of FIG. 14 is substantially the same as the embodiment of FIG. 8; and, therefore, redundant descriptions may be omitted.

The embodiment of FIG. 14 is different from the embodiment of FIG. 8 in that the metal material 813 functioning as the reflective partition walls is omitted. For example, in the light control pattern layer LCP, the organic film pattern 811 and the planarization film 812 may have different refractive indices. In other words, the refractive index of the organic film pattern 811 may be different from that of the planarization film 812.

Referring to FIG. 14, the organic film pattern 811 may be formed as a relatively low refractive organic film. In addition, the planarization film 812 may be formed as a relatively high refractive organic film. Accordingly, the side surfaces of the organic film pattern 811 forming the openings OP in the blue pixels SB can cause total reflection of light incident on the slopes inclined at an angle (e.g., a predetermined angle).

In FIG. 14, arrows 801 indicate that some of the white light that is emitted from the third emissive layer EL_B in line with the blue pixel SB and travels toward the slopes is totally reflected off the side surfaces of the organic film pattern 811 toward the front surface of the display panel 510.

On the other hand, as shown by an arrow 802 in FIG. 14, light exiting from the red pixel SR, which is a second color pixel overlapping the organic film pattern 811, passes through the organic film pattern 811 and the planarization film 812 to travel toward the front side of the display panel 510. In addition, as shown by an arrow 803 in FIG. 14, light exiting from the green pixel SG, which is a third color pixel overlapping the organic film pattern 811, passes through the organic film pattern 811 and the planarization film 812 to travel toward the front side of the display panel 510.

Although the light control pattern layer LCP is shown including the opening OP in one pixel having a low emission efficiency among the first color pixels, the second color pixel, and the third color pixel according to the embodiments of FIGS. 8 to 14, embodiments of the present disclosure are not limited thereto. For example, the openings OP created by patterning the organic film pattern 811 of the light control pattern layer LCP may be formed in two pixels having low emission efficiency among the first color pixel, the second color pixel, and the third color pixel and may not be formed in the pixel having the highest emission efficiency. Accordingly, as long as the openings OP of the organic film pattern 811 are formed in either one color pixel or a plurality of color pixels excluding some pixels having highest emission efficiency among the first color pixels, the second color pixels, and the third color pixels, it should be understood as falling within the scope of the present disclosure.

The organic film pattern 811 is disposed in line with the third color pixel having a relatively high emission efficiency among the first color pixel, the second color pixels, and the third color pixel, and, thus, openings OP are formed in the first color pixel and the second color pixel having a relatively low emission efficiency. Accordingly, the side surface of the organic film layer pattern 811 disposed adjacent to the opening OP in each of the first color pixel and the second color pixel includes a slope inclined at an angle (e.g., a predetermined angle).

In the above example, the first color pixel may be a blue pixel SB emitting blue light, the second color pixel may be a red pixel SR emitting red light, and the third color pixel may be a green pixel SG emitting green light.

Alternatively, in the above example, the first color pixel may be a green pixel SG emitting green light, the second color pixel may be a blue pixel SB emitting blue light, and the third color pixel may be a red pixel SR emitting red light.

Alternatively, in the above example, the first color pixel may be a red pixel SR emitting red light, the second color pixel may be a green pixel SG emitting green light, and the third color pixel may be a blue pixel SB emitting blue light.

In the embodiment shown in FIG. 8, on the slope formed on the side surface of the organic film pattern 811, a metal material (e.g., 813 of FIG. 8) reflects light emitted from the emissive layer of the first color pixel or the second color pixel toward the side surface of the organic film pattern 811 toward the front side of the display panel.

In another embodiment, the metal material (e.g., 813 in FIG. 8) is omitted, and the refractive index of the organic film pattern 811 is designed to be lower than that of the planarization film 812. In this instance, the light emitted from the emissive layer of a first color pixel toward the side surface of the organic film pattern 811 is totally reflected toward the front side of the display panel 510 due to the difference between the refractive index of the organic film pattern 811 and the refractive index of the planarization film.

While some example embodiments have been described herein, those skilled in the art will appreciate that many variations and modifications can be made to the embodiments without departing from the principles of the present invention. As such, the disclosed embodiments of the invention are to be considered in a generic and descriptive sense and not for purposes of limitation.

What is claimed is:

1. A display device comprising:
- a glass located in a display area of a lens;
- a display panel comprising an OLED on a semiconductor wafer substrate; and
- a reflective member to reflect display light exiting from the display panel toward the glass,
- wherein the display panel comprises:
- an emissive layer;
- an encapsulation layer on the emissive layer; and
- a light control pattern layer on the encapsulation layer and comprising an organic film pattern and a planarization film covering an upper surface of the encapsulation layer,
- wherein the organic film pattern is arranged in line with a second color pixel and a third color pixel among a first color pixel, the second color pixel, and the third color pixel, and forms an opening in the first color pixel,
- wherein a side surface of the organic film pattern adjacent to the opening comprises a slope inclined at an angle in the first color pixel, and
- wherein an emission efficiency of the first color pixel is lower than an emission efficiency of the second color pixel and an emission efficiency of the third color pixel.

2. The display device of claim 1, wherein the first color pixel is a blue pixel emitting blue light, the second color pixel is a red pixel emitting red light, and the third color pixel is a green pixel emitting green light.

3. The display device of claim 1, wherein the first color pixel is a green pixel emitting green light, the second color pixel is a blue pixel emitting blue light, and the third color pixel is a red pixel emitting red light.

4. The display device of claim 1, wherein the first color pixel is a red pixel emitting red light, the second color pixel is a green pixel emitting green light, and the third color pixel is a blue pixel emitting blue light.

5. The display device of claim 1, further comprising a metal material on the slope of the side surface of the organic film pattern to reflect light emitted from the emissive layer of the first color pixel toward the side surface of the organic film pattern toward a front side of the display panel.

6. The display device of claim 1, wherein the emissive layer is configured to emit white light, and the display device further comprises a color filter on the light control pattern layer.

7. The display device of claim 1, wherein a refractive index of the organic film pattern is lower than a refractive index of the planarization film.

8. The display device of claim 1, wherein the reflective member comprises a diffractive optical element.

9. The display device of claim 1, wherein the reflective member comprises a reflective optical element.

10. A display device comprising:

a glass located in a display area of a lens;

a display panel comprising an OLED on a semiconductor wafer substrate; and a reflective member to reflect display light exiting from the display panel toward the glass, wherein the display panel comprises:

an emissive layer:

an encapsulation layer on the emissive layer; and a light control pattern layer on the encapsulation layer and comprising an organic film pattern and a planarization film covering an upper surface of the encapsulation layer, wherein the organic film pattern is arranged in line with a second color pixel and a third color pixel among a first color pixel, the second color pixel, and the third color pixel, and forms an opening in the first color pixel, wherein a side surface of the organic film pattern adjacent to the opening comprises a slope inclined at an angle in the first color pixel, wherein a refractive index of the organic film pattern is lower than a refractive index of the planarization film, and wherein light emitted from the emissive layer of the first color pixel to the side surface of the organic film pattern is totally reflected toward a front side of the display panel via a difference between the refractive index of the organic film pattern and the refractive index of the planarization film.

11. A display device comprising:

a glass located in a display area of a lens;

a display panel comprising an OLED on a semiconductor wafer substrate; and a reflective member to reflect display light exiting from the display panel toward the glass, wherein the display panel comprises:

an emissive layer;

an encapsulation layer on the emissive layer; and a light control pattern layer on the encapsulation layer and comprising an organic film pattern and a planarization film covering an upper surface of the encapsulation layer, wherein the organic film pattern is arranged in line with a third color pixel among a first color pixel, a second color pixel, and the third color pixel, and forms respective openings in the first and second color pixels, wherein, in each of the first and second color pixels, a side surface of the organic film pattern adjacent to the respective opening comprises a slope inclined at an angle, and wherein an emission efficiency of the third color pixel is higher than an emission efficiency of the first color pixel and an emission efficiency of the second color pixel.

12. The display device of claim 11, wherein the first color pixel is a blue pixel emitting blue light, the second color pixel is a red pixel emitting red light, and the third color pixel is a green pixel emitting green light.

13. The display device of claim 11, wherein the first color pixel is a green pixel emitting green light, the second color pixel is a blue pixel emitting blue light, and the third color pixel is a red pixel emitting red light.

14. The display device of claim 11, wherein the first color pixel is a red pixel emitting red light, the second color pixel is a green pixel emitting green light, and the third color pixel is a blue pixel emitting blue light.

15. The display device of claim 11, further comprising a metal material on the slope of the side surface of the organic film pattern to reflect light emitted from the emissive layer of the first or second color pixel toward the side surface of the organic film pattern toward a front side of the display panel.

16. The display device of claim 11, wherein the emissive layer is configured to emit white light, and the display device further comprises a color filter on the light control pattern layer.

17. The display device of claim 11, wherein a refractive index of the organic film pattern is lower than a refractive index of the planarization film.

18. The display device of claim 17, wherein light emitted from the emissive layer of the first color pixel to the side surface of the organic film pattern is totally reflected toward a front side of the display panel via a difference between the refractive index of the organic film pattern and the refractive index of the planarization film.

* * * * *